(12) United States Patent
Kakoschke

(10) Patent No.: US 8,518,759 B2
(45) Date of Patent: Aug. 27, 2013

(54) METHOD FOR PRODUCING AN INTEGRATED FIELD-EFFECT TRANSISTOR

(75) Inventor: Ronald Kakoschke, Munich (DE)

(73) Assignee: Infineon Technologies AG, Neubiberg (DE)

( * ) Notice: Subject to any disclaimer, the term of this patent is extended or adjusted under 35 U.S.C. 154(b) by 272 days.

(21) Appl. No.: 12/848,576

(22) Filed: Aug. 2, 2010

(65) Prior Publication Data

US 2010/0317162 A1 Dec. 16, 2010

Related U.S. Application Data

(62) Division of application No. 10/529,049, filed as application No. PCT/DE03/03131 on Sep. 19, 2003.

(30) Foreign Application Priority Data

Sep. 27, 2002 (DE) .................................. 102 45 153

(51) Int. Cl.
*H01L 21/00* (2006.01)

(52) U.S. Cl.
USPC .................................. 438/151; 257/E21.411

(58) Field of Classification Search
USPC .................. 257/E21.411; 438/157, 151, 164
See application file for complete search history.

(56) References Cited

U.S. PATENT DOCUMENTS

| | | | |
|---|---|---|---|
| 4,965,213 A | 10/1990 | Blake | |
| 4,996,574 A | 2/1991 | Shirasaki | |
| 5,683,918 A | 11/1997 | Smith et al. | |
| 5,821,575 A | 10/1998 | Mistry et al. | |
| 5,930,605 A | 7/1999 | Mistry et al. | |
| 6,300,182 B1 | 10/2001 | Yu | |
| 6,396,108 B1 | 5/2002 | Krivokapic et al. | |
| 6,797,566 B1 * | 9/2004 | Kobayashi et al. | 438/266 |
| 6,800,511 B2 | 10/2004 | Park et al. | |
| 2002/0130354 A1 | 9/2002 | Sekigawa et al. | |
| 2003/0178670 A1 | 9/2003 | Fried et al. | |
| 2005/0106799 A1 * | 5/2005 | Doris et al. | 438/199 |

FOREIGN PATENT DOCUMENTS

JP 05-075127 3/1993

OTHER PUBLICATIONS

J.M. Hwang, H. Lu, Y.D. Sheu, W. Bailey, P. Mei, G. Pollack, *Premature Breakdown in Non-Fully Depleted SOIIMosfets with Body-Tied-To-Source Structure*, pp. 34-35, SOI Conference, Proceedings. IEEE, Oct. 1, 1991.

(Continued)

*Primary Examiner* — Wael Fahmy
*Assistant Examiner* — Sarah Salerno

(57) ABSTRACT

A method for fabricating a field-effect transistor is provided. The method includes forming a substrate region, forming two terminal regions at the substrate region, one terminal region being a source region and the other terminal region being a drain region, forming two electrically insulating insulating layers, which are arranged at mutually opposite sides of the substrate region and are adjoined by control regions, forming an electrically conductive connecting region, which electrically conductively connects one of the terminal regions and the substrate region the conductive connecting region comprising a metal-semiconductor compound, leveling a surface by chemical mechanical polishing after forming the control regions, etching-back the control regions after polishing, and performing a self-aligning method for forming the metal-semiconductor compound in the etched-back regions, on the substrate region, and on a terminal region.

5 Claims, 10 Drawing Sheets

(56) References Cited

OTHER PUBLICATIONS

C.J. Chang-Hasnain, J.P. Harbison, C.E. Zah, L.T. Florez and N.C. Andreadakis, *Supression of Latch in SOI Mosfits By Si/icidation of Source*, pp. 1003-1005, Electronics Letters, vol. 27, May 23, 1991.

F.L. Duan and D.E. Ioannou, *Design and Analysis of a Novel Mixed Accumulations/Inversion Mode FD SOI Mosfet*, pp. 100-101, Proceedings IEEE International SOI Conference, Oct. 1997.

S. Cristoloveanu and G. Reichert, *Recent Advances in SOI Materials and Device Technologies for High Temperature*, pp. 86-93, High-Temperature Electronics, Materials, Devices and Sensors Conference, IEEE, Feb. 1998.

Srinath Krishnan, *Efficacy of Body Ties Under Dynamic Switching Conditions in Partially Depleted SOI CMOS Technoloav*, pas. 140-141, IEEE International SOI Conference, 1997.

Jeffrey W. Sleight, *DC and Transient Characterization a Compact Schottky Body Contact Technology for SOI Transistors*, pp. 1451-1456, IEEE Transactions on Electron Devices, Jul. 1999.

International Search Report from corresponding PCT application No. PCT/DE03/03131, 2005.

Examination Report from corresponding PCT application No. PCT/DE03/03131, 2005.

Japanese Office Action for Serial No. 2004-540489, Dated Nov. 21, 2008.

\* cited by examiner

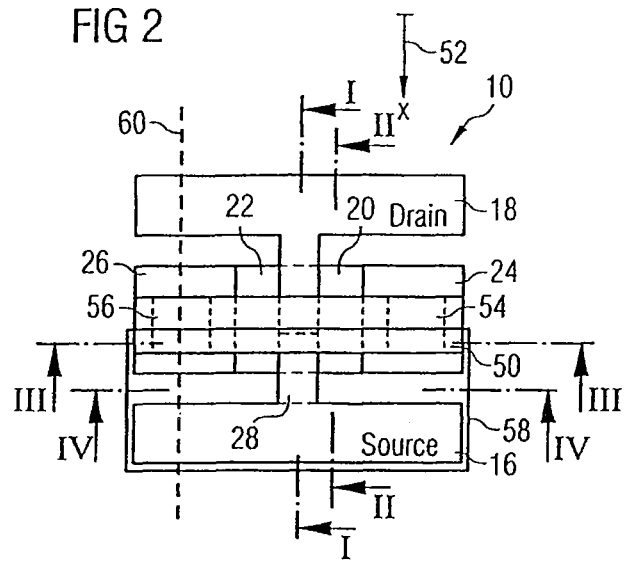
FIG 2
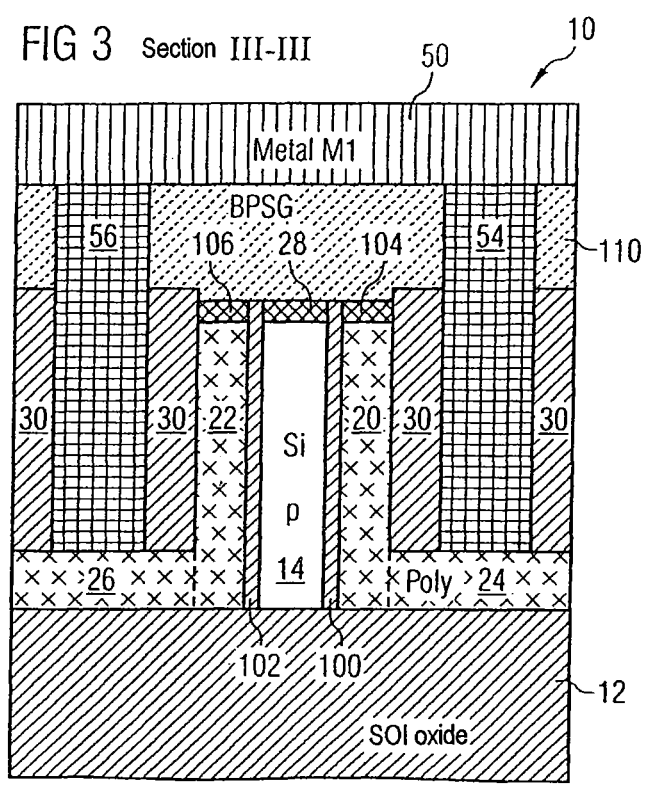
FIG 3 Section III-III

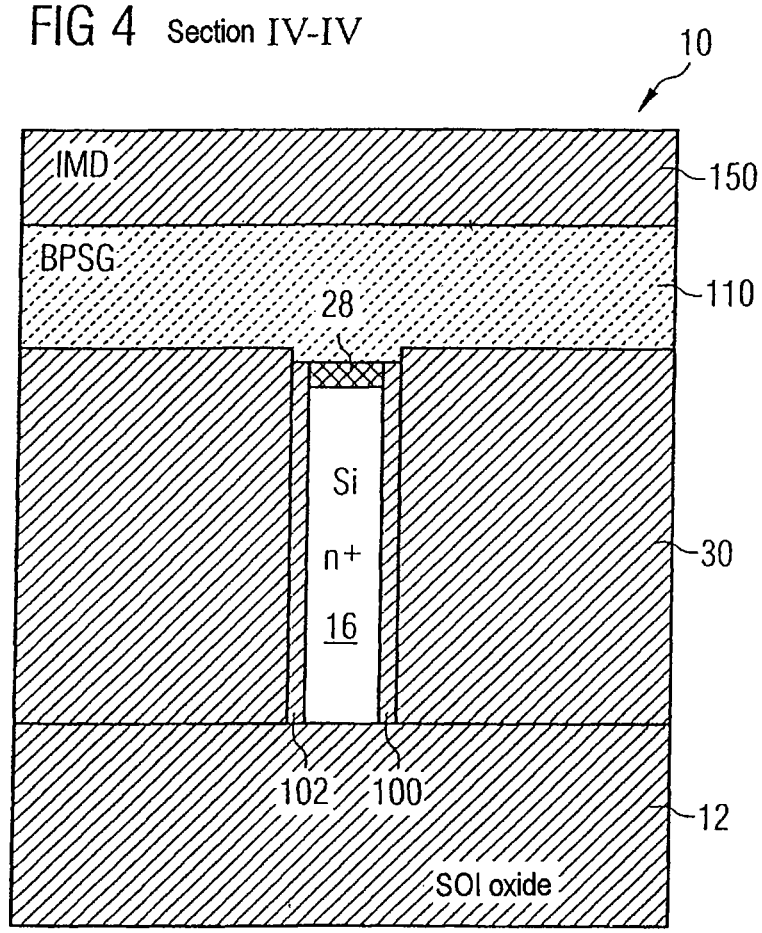

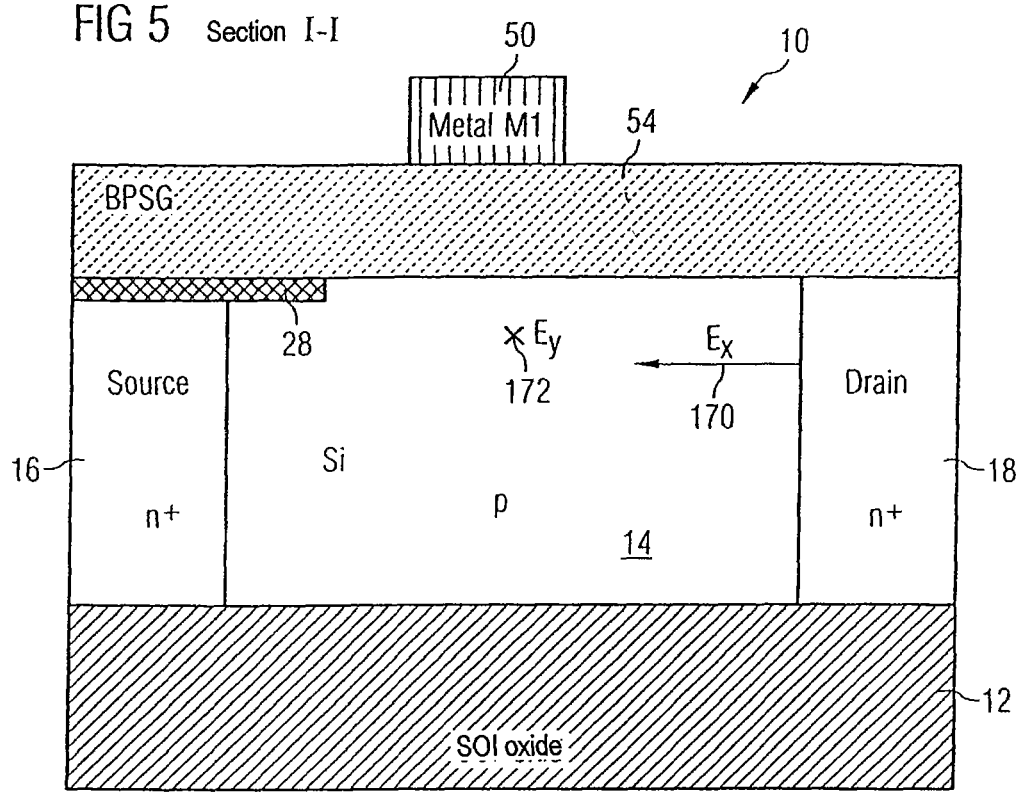

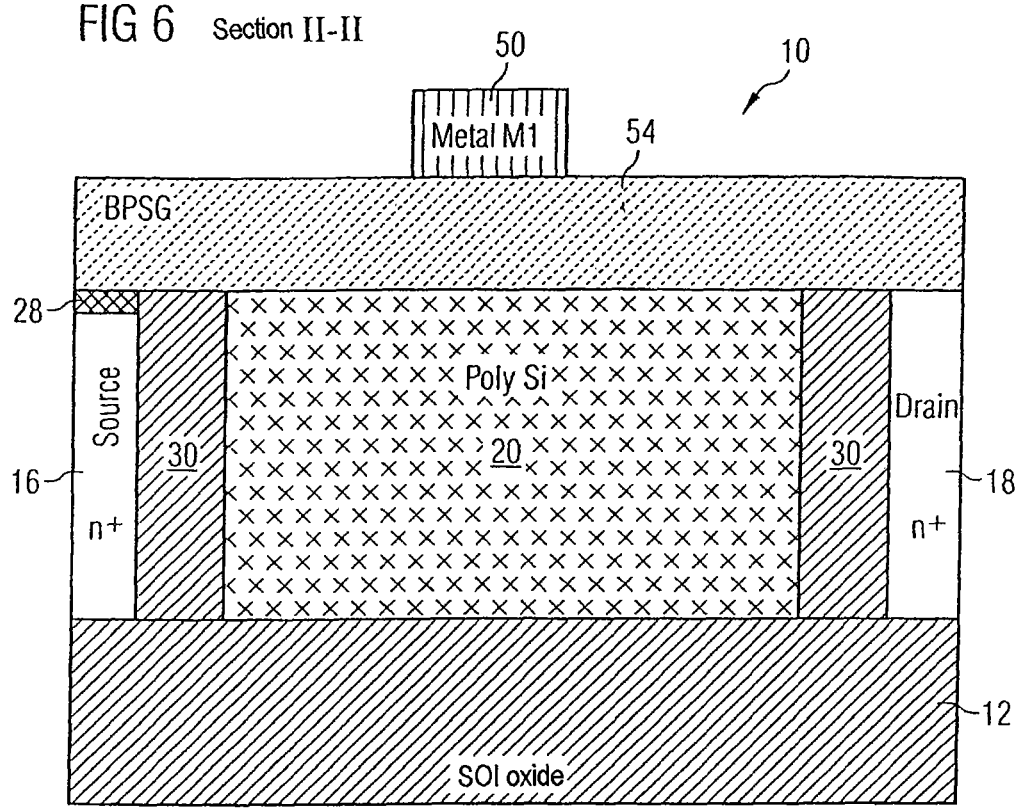

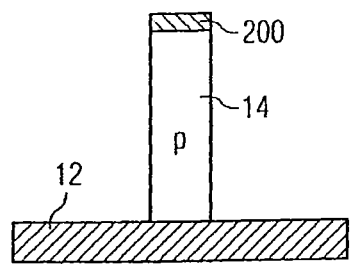
FIG 7A  Section III-III
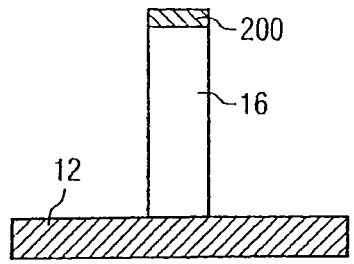
FIG 7B  Section IV-IV
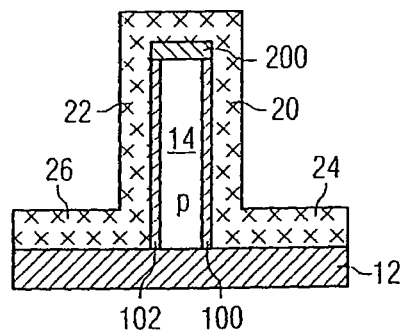
FIG 8A  Section III-III
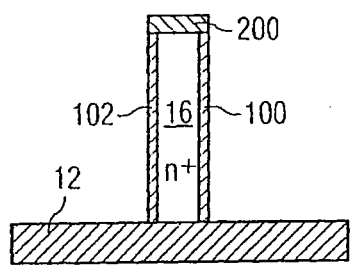
FIG 8B  Section IV-IV
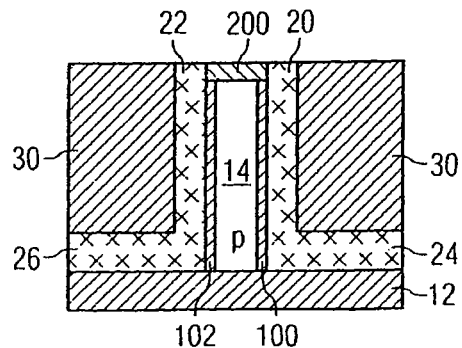
FIG 9A  Section III-III
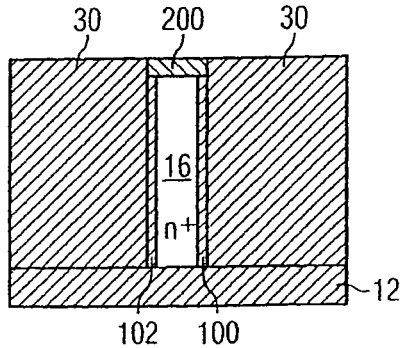
FIG 9B  Section IV-IV FIG 10A  Section III-III
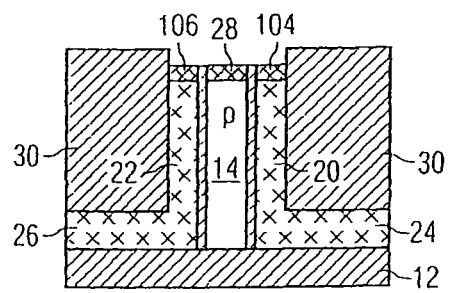
FIG 10B  Section IV-IV
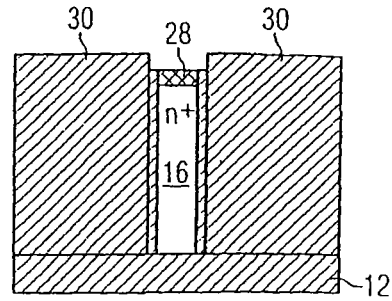
FIG 11A  Section III-III
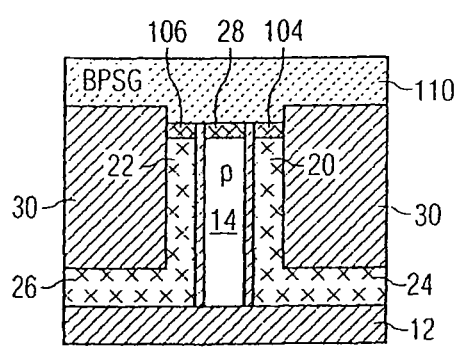
FIG 11B  Section IV-IV
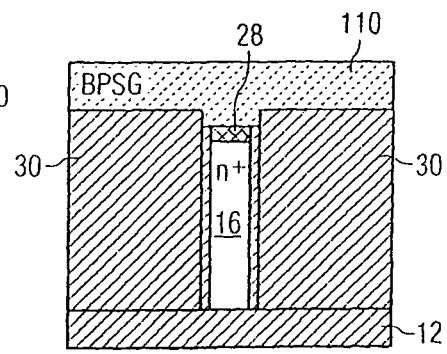
FIG 12A  Section III-III
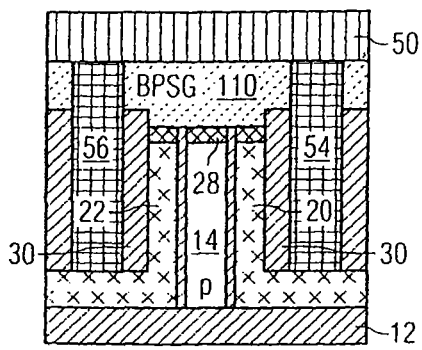
FIG 12B  Section IV-IV
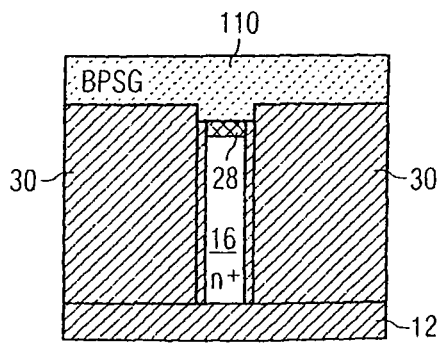

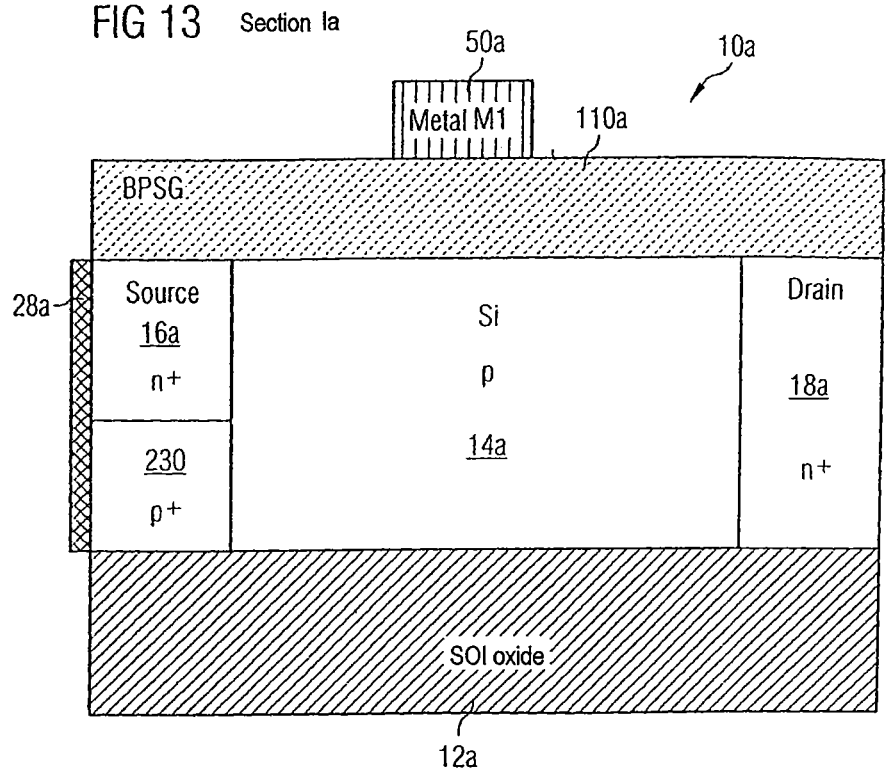
FIG 13 Section Ia

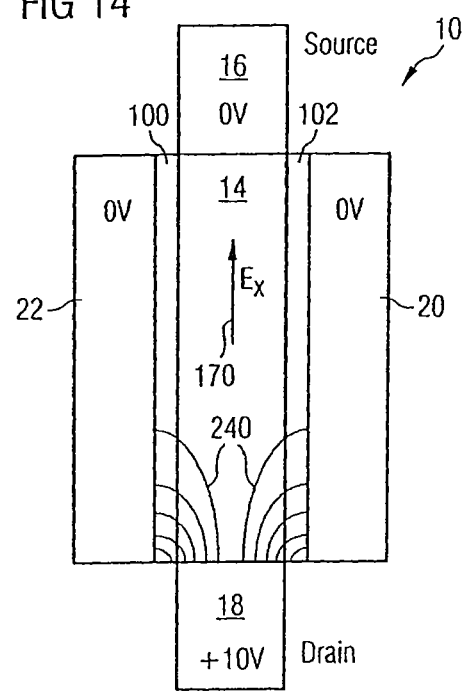
FIG 14
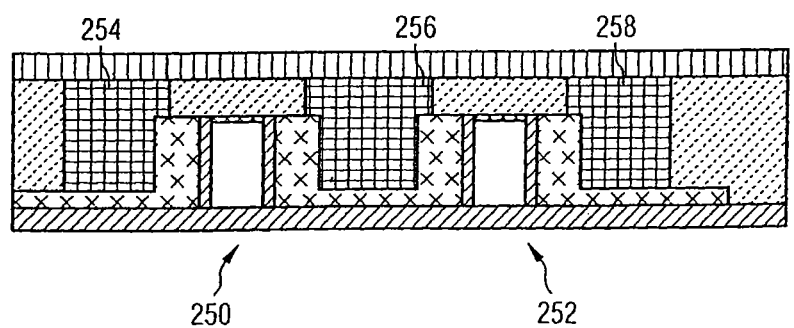
FIG 15  Section IIIa

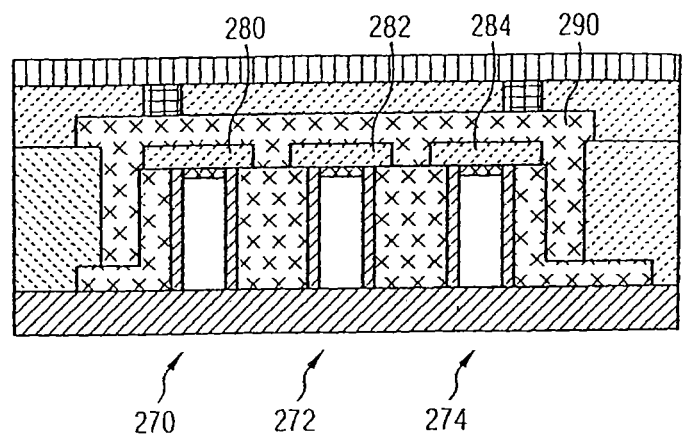
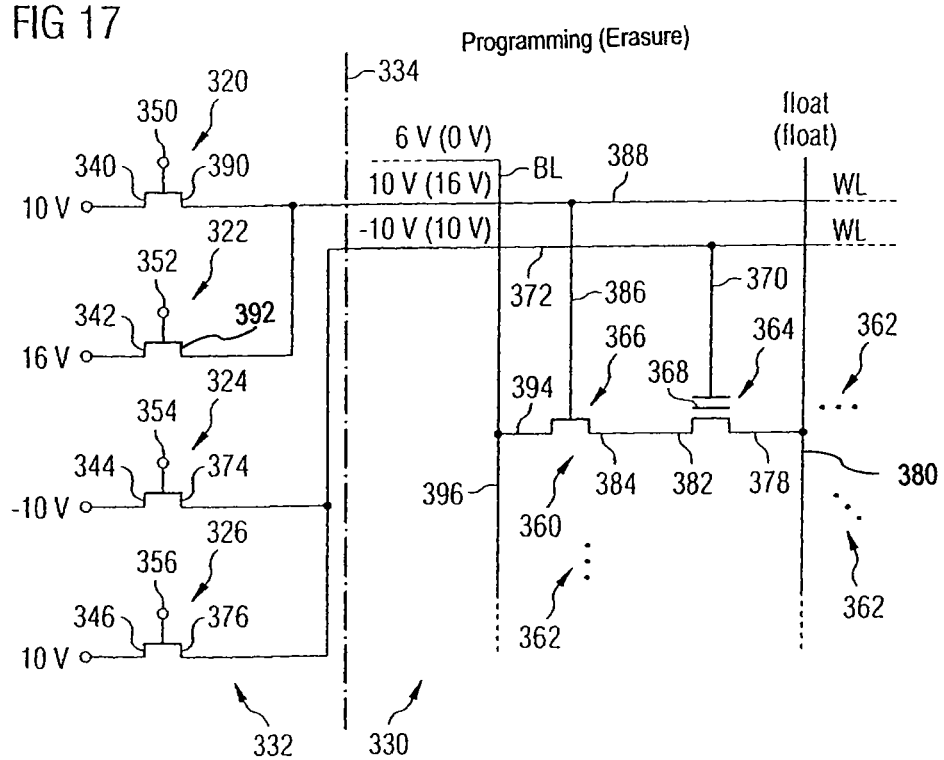

METHOD FOR PRODUCING AN INTEGRATED FIELD-EFFECT TRANSISTOR

CROSS-REFERENCE TO RELATED APPLICATIONS

This application is a divisional application of the national stage application Ser. No. 10/529,049 of international application number PCT/DE03/03131, filed on Sep. 19, 2003, which claims the benefit of priority to German Patent Application 102 45 153.2, filed on Sep. 27, 2002, all of which are incorporated herein by reference.

FIELD OF INVENTION

The invention relates to an integrated field-effect transistor having a substrate region, at least two doped terminal regions and a control region. The terminal regions are usually referred to as source and as drain. The control region is also referred to as gate.

SUMMARY OF THE INVENTION

It is an object of the invention to specify a simply constructed field-effect transistor which has a small area requirement, is suitable for switching voltages having a magnitude of greater than five volts or greater than nine volts and has outstanding short-channel properties, in particular a high drain current and a good blocking property. Moreover, the intension is to specify a use for said transistor and a simple method for fabricating said transistor.

The field-effect transistor according to the invention contains a usually doped substrate region surrounded, for example completely or to the extent of at least seventy-five percent by the following regions:
  two doped terminal regions,
  two electrically insulating control region insulating layers,
  and at least one electrically insulating region, whose thickness, in one configuration, is at least twice or at least ten times the insulating thickness of a control region insulating layer.

In addition, the field-effect transistor according to the invention contains an electrically conductive connecting region between one terminal region and the substrate region or between one terminal region and a region—leading to the substrate region—of the same conduction type as the substrate region.

The use of two control regions leads to a small area requirement and to outstanding short-channel properties. Surrounding the control region with at least one electrically insulating region serves for isolating the substrate region from a main substrate of an integrated circuit arrangement containing the integrated field-effect transistor. The electrically conductive connection between the terminal region and the substrate region makes it possible to connect the substrate isolated from the main substrate without an additional area requirement for a substrate terminal such that disturbing charge carriers are efficiently removed from the substrate of the field-effect transistor.

The use of a substrate insulated by at least one insulating region and the connection of the substrate to one terminal region make it possible to suppress parasitic bipolar effects without an additional area requirement for terminals of the substrate, so that it is possible to switch, inter alia, switching voltages having a magnitude of greater than five volts or greater than nine volts. By way of example, the substrate region and the source terminal region are kept at the same potential, a column terminal being used. In one configuration, the Schottky barrier between the silicide and the substrate is kept as small as possible.

In one development of the field-effect transistor according to the invention, the conductive connecting region contains a silicide or comprises a silicide. Refractory metal silicides or silicides with rare earth metals are used in configurations. The use of silicides affords the possibility of fabricating the conductive connecting region with the aid of the so-called salicide technique (self-aligned silicide). In this technique, the silicide is produced selectively on silicon or polysilicon surfaces, but not on silicon dioxide surfaces or surfaces made of a different material. This measure means that it is not necessary to perform an additional lithography method during the fabrication of the conductive connecting region. However, it is also possible to perform a lithography method in which a mask containing only rectangular regions, for example, is produced. However, on account of the selectivity during the salicide method, the siliconized regions have structures which deviate from the rectangular form. Cobalt silicide, platinum silicide, erbium silicide or nickel silicide is used, by way of example, as the silicide.

If other semiconductor materials are used instead of silicon, e.g. germanium, then methods similar to the salicide method are utilized in order to selectively form metal-semiconductor compounds.

In other developments, a conductive connecting region comprising monocrystalline silicon, comprising polycrystalline silicon or comprising a metal is used.

In a next development, the individual elements of the field-effect transistor have dimensions and/or structures which permit the switching of voltages of greater than five volts or even greater than nine volts or greater than fifteen volts, but preferably less than thirty volts:
  insulating layers for insulating the control regions from the substrate region have an insulating layer thickness of at least fifteen nanometers or of at least twenty nanometers,
  the distance between the terminal regions is at least 0.3 micrometer or at least 0.4 micrometer,
  the terminal regions have a shallow doping profile gradient of, for example, about 200 nanometers per decade in comparison with the doping profiles of planar field-effect transistors.

The measures mentioned have the result, individually and, in particular cumulatively, that it is possible to switch voltages having a magnitude of greater than five volts or even greater than nine volts.

In a next development, an insulating region of the field-effect transistor is part of an insulating layer which carries a multiplicity of field-effect transistors. In one configuration, the insulating layer comprises silicon dioxide. If silicon is used as the substrate material, then the fabrication technique is also referred to as the SOI technique (Silicon On Insulator).

In another development, the substrate region is monocrystalline and doped in accordance with one conduction type. The terminal regions are likewise monocrystalline but doped in accordance with another conduction type. The substrate region is doped homogeneously or inhomogeneously.

In a next development of the field effect transistor, the control regions are electrically conductively connected to one another, thereby producing a so-called double gate transistor having outstanding short-channel properties.

In a next development of the field-effect transistor, the substrate region has six side areas arranged in parallelepipedal form or in the form of a truncated pyramid with respect to one another. The terminal regions, the insulating layers with respect to the control regions and the insulating regions each lie at opposite sides of the substrate region.

In one configuration, a plane containing the terminal regions and the control regions lies parallel to the carrier substrate. The insulating regions lie on both sides of this plane. In this case, an insulating region is part of an SOI substrate.

By contrast, if the plane in which the terminal regions and the control regions are situated is arranged transversely, e.g. at an angle of ninety degrees with respect to a carrier substrate plane, then a field oxide technique or an STI technique (Shallow Trench Isolation) is used, by way of example, for fabricating the insulation regions. The different arrangements of the plane in which the terminal regions and the control regions are situated give rise to field-effect transistors whose channel lies transversely (vertically) with respect to the carrier substrate or parallel (horizontally) with respect to the carrier substrate.

The invention additionally relates to the use of the field-effect transistor according to the invention or one of its developments for switching voltages having a magnitude of greater than five volts or even greater than nine volts or greater than fifteen volts, but preferably less than thirty volts, in particular as a driving transistor on a word line or a bit line of a memory cell array. In one configuration, the memory cell array is a so-called flash memory or an EEPROM memory (Electrically Erasable Programmable Read Only Memory). In the case of flash memories, only the individual memory areas can be selectively erased, and not, by contrast, individual memory cells or individual memory words.

The aspect of the invention which relates to the use of the field-effect transistor is based on the consideration that, for a number of reasons, a departure should be made from the direction previously taken in the fabrication of driving transistors for memory cell arrays, in order to be able to fabricate smaller memory modules:

planar field-effect transistors for switching voltages having magnitudes of greater than five volts or even greater than nine volts can no longer be miniaturized on account of physical limits, even when using the so-called split-voltage technique, it is necessary to switch programming voltages whose magnitude is greater than five volts or even greater than nine volts, a reduction of the magnitudes of the voltages to be switched would be associated with a reduction of the tunnel oxide thickness. However, the reduction of this thickness leads to reliability problems, so that this route is associated with many difficulties.

Therefore, the invention's use for driving the memory cell array uses a field-effect transistor which has the construction mentioned above and therefore also exhibits the effects mentioned above, in particular enables the switching of voltages having magnitudes of greater than five volts or even greater than nine volts, has a small area requirement, has outstanding short-channel properties and is simple to fabricate.

The invention additionally relates to a method for fabricating a field-effect transistor, in particular for fabricating the field-effect transistor according to the invention or one of its developments. In the method according to the invention, the following method steps are embodied without restriction by the order specified:

formation of a substrate region, formation of two doped terminal regions at the substrate region, formation of two mutually opposite insulating layers with respect to two control regions, and formation of an electrically conductive connecting region between one terminal region and the substrate region or between one terminal region and a region—leading to the substrate region—of the same conduction type as the substrate region.

On account of this procedure, the technical effects mentioned above likewise apply to the method. In one development, the method is particularly simple if the connecting region is fabricated by a method for selectively applying a silicide.

BRIEF DESCRIPTION OF THE DRAWINGS

Exemplary embodiments of the invention are explained below with reference to the accompanying drawings, in which:

FIG. 2 shows a plan view of the field-effect transistor,

FIG. 3 shows a sectional illustration of the field-effect transistor in a section plane which lies transversely with respect to the channel direction and contains a substrate region, FIG. 4 shows a sectional illustration of the field-effect transistor in a section plane which lies transversely with respect to the channel direction and contains a source region, FIG. 5 shows a sectional illustration of the field-effect transistor in a section plane which lies longitudinally with respect to the channel direction and contains the substrate region, FIG. 6 shows a sectional illustration of the field-effect transistor in a section plane which lies longitudinally with respect to the channel direction and contains a control region, FIGS. 7A to 12B show fabrication stages in the fabrication of the field-effect transistor, FIG. 13 shows an exemplary embodiment of the field-effect transistor with a connecting region doped in portions, FIG. 14 shows an illustration of the field profile in the substrate region of the field-effect transistor, FIG. 15 shows an exemplary embodiment with two parallel-connected field-effect transistors and self-aligning contact holes, FIG. 16 shows an exemplary embodiment with three parallel-connected field-effect transistors and a polycrystalline connecting line, and FIG. 17 shows the use of the field-effect transistor in a driving circuit for a memory cell array in an EEPROM.

DETAILED DESCRIPTION

Figure 1:
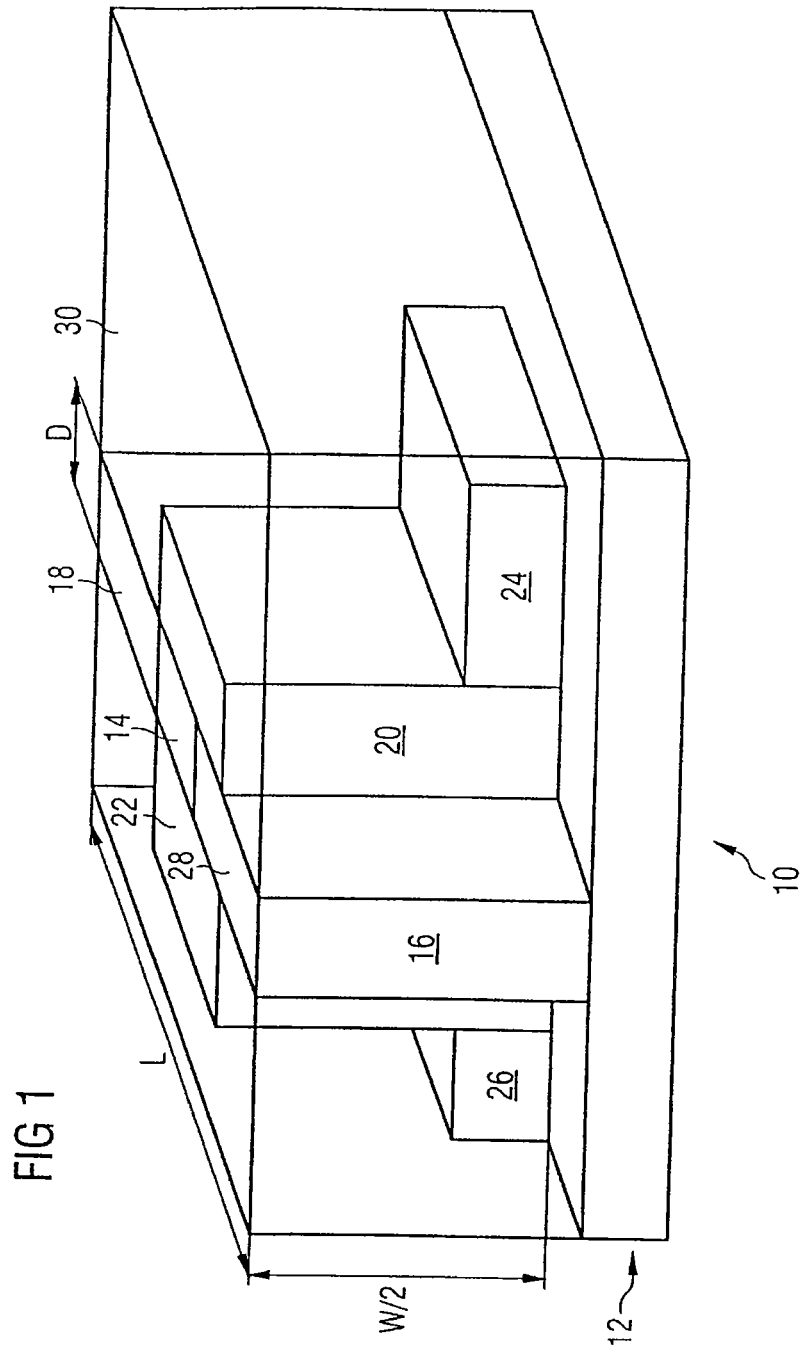
FIG. 1 shows an integrated field-effect transistor with two control regions.

FIG. 1 shows an integrated field-effect transistor 10 situated on an insulating layer 12. The insulating layer 12 comprises silicon dioxide, for example, and is part of a main substrate carrying a multiplicity of integrated field-effect transistors 10 in an integrated circuit.

The field-effect transistor 10 contains a parallelepipedal substrate region 14, which is p-doped in the exemplary embodiment. In another exemplary embodiment, the substrate region 14 is n-doped, thereby producing a p-channel enhancement-mode transistor.

The parallelepipedal substrate region 14 has a height corresponding approximately to half the channel width W of the field-effect transistor 10. A length L of the parallelepipedal substrate region 14 corresponds to a channel length. The parallelepipedal substrate region 14 has a thickness D corresponding approximately to a third of the length L.

A source region 16 and a drain region 18, which are both n-doped, are arranged at the long narrow sides of the parallelepipedal substrate region 14. Gate regions 20 and 22 are situated at the mutually opposite wide side areas of the substrate region 14, said gate regions comprising doped polysilicon and being isolated from the substrate region 14 by a gate oxide layer (not illustrated in FIG. 1) having a thickness of fifteen nanometers. The gate region 20 and 22 is adjoined by a polyregion 24 and 26, respectively, likewise compromising doped polycrystalline silicon.

The short narrow sides of the substrate region 14 adjoin the insulating layer 12 in the case of the bottom area of the parallelepipedal substrate region 14 and an insulating layer (not illustrated) in the case of the covering area of the substrate region 14. Part of the covering area is covered by a connecting region 28, which extends further over the covering area of the source region 16 and thus produces an electrically conductive connection between the substrate region 14 and the source region 16. The connecting region 28 comprises a silicide.

Consequently, the substrate region 14 is completely enclosed by the source region 16, the drain region 18, the gate region 20, the gate region 22, the insulating layer 12 and the upper insulating layer (not illustrated) and also by part of the connecting region 28. The field-effect transistor 10 is enclosed by a filling oxide 30, for example by silicon dioxide.

FIG. 2 shows a plan view of the field-effect transistor 10. In addition to the regions already explained with reference to FIG. 1, the illustration shows a metal interconnect 50, whose longitudinal axis extends at a right angle with respect to a channel direction represented by a direction arrow 52. Connecting portions 54 and 56 extending through the filling oxide 30 lead from the metal interconnect 50 to the polyregions 24 and 26, respectively. The filling oxide 30 is not illustrated in FIG. 2 for reasons of improved clarity.

FIG. 2 additionally illustrates the positions of section planes III, IV, I and II, the associated sectional illustrations of which are explained in more detail below with reference to FIGS. 3, 4, 5 and 6. FIG. 2 furthermore illustrates a rectangular mask window 58 enclosing the T-shaped source region 16. The mask window 58 serves for selectively producing the salicide in the connecting region 28 and also on the rest of the covering area of the source region 16.

In another exemplary embodiment, at least two field-effect transistors 10 are connected in parallel. For this case, the structure shown in FIG. 2 is to be mirrored toward the left along a broken line 60. This means, inter alia, that the source region 16 and the drain region 18 are formed continuously toward the left to the next array of the field-effect transistor. The mask window 58 extends over the extended source region 16 in this exemplary embodiment.

FIG. 3 shows a sectional illustration of the field-effect transistor 10 in the section plane III. Regions comprising silicon dioxide are hatched with straight lines in the figures. This relates to the insulating layer 12, the filling oxide 30 and also gate oxide regions 100 and 102 in FIG. 3.

Regions comprising monocrystalline silicon are solid white in the figures, see for example the substrate region 14 in FIG. 3. Polycrystalline regions are covered with crosses, see for example the gate regions 20 and 22 and also the polyregions 24 and 26 in FIG. 3. Regions comprising metal are hatched vertically, see for example the metal interconnect 50, which comprises copper or aluminum, for example.

Regions in which refractory metals are situated are represented by regions with grid network lines running horizontally and vertically, see for example the connecting portions 54 and 56. Regions in which silicides are situated are represented by grid network lines running obliquely in the figures. In FIG. 3, this applies to the connecting region 28 and also to salicide regions 104 and 106, which are situated on regions of the gate regions 20 and 22 that are near to the source region 16.

Finally, regions in which a borophosphosilicate glass (BPSG) is situated in the exemplary embodiment are hatched with broken lines, see for example an insulating region 110 between the metal interconnect 50 and the filling region 30.

FIG. 4 shows a sectional illustration of the field-effect transistor 10 along the section plane IV. As can be discerned in FIG. 4, the oxide of the gate oxide regions 100 and 102, respectively, also extends along the source region 16. In the section plane IV, the silicate glass layer 110 is coated with an intermetal dielectric 150, comprising silicon dioxide in the exemplary embodiment. Regions beside the connecting region 28 are not covered with silicide in the section plane IV since silicon dioxide of the filling region 30 adjoins the gate oxide 100 and 102, respectively, at the level of the connecting region 28 in the section plane IV.

FIG. 5 shows a sectional illustration of the field-effect transistor 10 along the section I. FIG. 5 additionally illustrates an x-component 170 of the electric field and a y-component 172 of the electric field in the substrate region 14. The x-component 170 points from the drain region 18 to the source region 16. The y-component 172 points into the plane of the drawing from the gate region 20 to the gate region 22.

FIG. 6 shows a sectional illustration of the field-effect transistor 10 in the section plane II. It can readily be discerned that the connecting region 28 is also situated above that region of the source region 16 which does not lead directly to the substrate region 14.

FIGS. 7A and 7B show a first fabrication stage in the fabrication of the field-effect transistor 10. The fabrication starts proceeding from an SOI substrate (Silicon On Insulator) in which a silicon layer situated on the insulating layer 12 has a thickness of one hundred nanometers in the exemplary embodiment, and is already p-doped. A so-called hard mask comprising silicon nitride 200 is fabricated on the silicon layer. To that end, the silicon nitride 200 is produced over the whole area. The layer comprising silicon nitride 200 is then patterned with the aid of a photolithographic method, and opened above the regions in which the filling region 30 is later situated. A reactive ion etching is subsequently carried out, stopping on the insulating layer 12. There remain on the insulating layer 12 the substrate region 14, see section III, and the source region 16, see section IV, and also the drain region 18.

As illustrated in FIGS. 8A and 8B for the section III and the section IV, respectively, the gate oxide regions 100 and 102 are subsequently fabricated, for example with the aid of a thermal oxidation. The oxide of the gate oxide regions 100 and 102, respectively, extends not only along the substrate region 14 but also along the source region 16 and along the drain region 18.

Afterward, a layer comprising polycrystalline silicon is deposited and patterned with the aid of a photolithographic method. The gate regions 20 and 22 and the polyregions 24 and 26 are produced during the patterning, see section III. In the region of the section IV, by contrast, the polysilicon is removed again during the patterning.

After the patterning of the polysilicon, an inclined implantation of LDD regions (Lightly Doped Drain) is carried out. Afterward, the source region 16 and the drain region 18 are doped, e.g. heavily n-doped, i.e. n+, with the aid of an ion implantation. The polycrystalline gate regions 20 and 22 and the polyregions 24 and 26 are doped at the same time.

As illustrated in FIGS. 9A and 9B, silicon dioxide is deposited after the implantation in the filling region 30. The interspaces between different substrate regions 14 and different drain regions 16 or 18 are thus filled. After the filling of the filling regions 30, a chemical mechanical polishing method (CMP) is carried out, stopping on the silicon nitride 200. The CMP method produces a level surface again.

Afterward, the polycrystalline silicon is etched back somewhat with the aid of a dry etching process until it has the same height as the substrate region 14. As a result of this etching-back step, an identical height level is produced for the subsequent application of the silicide layer in the region of the substrate region 14.

As shown in FIGS. 10A and 10B, the silicon nitride 200 is then removed above the source region 16 and above the region of the substrate region 14 above which the connecting portion 28 is later arranged. For this purpose, the photo resist layer is applied and patterned with the aid of a photolithographic method, the mask window 58 illustrated in FIG. 2 being produced above the source region 16 and also above the polyregion 20 to 26 on the source side. The silicon nitride 200 is then removed within the mask window 58. The photo resist layer containing the mask window 58 is then removed.

Afterward, nickel, for example, is applied over the whole area and, during a heat treatment step at, for example, 500 degrees Celsius, forms a silicide compound above regions comprising silicon, i.e. above the substrate region 14, the source region 16, the gate region 20 and the gate region 22. The connecting region 28 is produced on the uncovered part of the substrate region 14 and the silicide regions 104 and 106 are produced on the gate regions 20 and 22, respectively.

The nickel is subsequently removed in regions in which silicide has not formed. By way of example, the nickel is removed by means of a wet-chemical etching process.

As illustrated in FIGS. 11A and 11B, the silicate glass 110 is subsequently applied over the whole area. The silicate glass 110 is spun on, by way of example.

As illustrated in FIGS. 12A and 12B, the connecting portions 54 and 56 are then fabricated. To that end, a photolithographic method is performed in order to produce in the silicate glass 110 contact holes which are intended to accommodate the connecting portions 54 and 56. The contact holes are then filled e.g. with tungsten in order to form the connecting portions 54 and 56. As shown in FIG. 12A, the contact holes are produced in such a way that filling material 30 remains between the connecting portion 54 and the gate region 20. Filling material 30 also remains between the connecting portion 56 and the gate region 22.

The metal interconnect 50 leading to the connecting portions 54 and 56 is then produced. By way of example, the metal interconnect 50 contains aluminum as the main constituent. In this case, aluminum is applied over the whole area and then patterned with the aid of a photolithographic method. In this case, the metal layer is removed again, inter alia, above the silicate glass 110 along the section plane IV.

FIG. 13 shows an exemplary embodiment of a field-effect transistor 10a along a section Ia, the position of which corresponds to the position of section I. Like the field-effect transistor 10, the field-effect transistor 10a contains an insulating layer 12a, a substrate region 14a, a source region 16a, a drain region 18a and a connecting region 28a. The field-effect transistor 10a is covered by a silicate glass 110a, e.g. by borophosphosilicate glass (BPSG) which serves for insulating metal interconnect 50a.

In contrast to the field-effect transistor 10, the connecting region 28a is situated transversely with respect to a channel that forms during the operation of the field-effect transistor 10a. The source region 16a is only about half as deep as the source region 16. Situated between the source region 16a and the insulating region 12a is a p-doped region 230, i.e. a region having a doping of the same conduction type as the substrate region 14a. The connecting region 28a connects the source region 16a and the region 230. The substrate region 14a is thus connected to the connecting region 28a via the region 230.

The connecting region 28a can in turn be fabricated by means of silicides using the salicide technique. However, in another exemplary embodiment, metals are used for fabricating the connecting region 28a.

In another exemplary embodiment, the source region 16a and the region 230 are interchanged. Only the region 230 is contact-connected with a contact in this case.

In a further exemplary embodiment of the transistor illustrated in FIG. 13, the polycrystalline silicon is not removed above the substrate region 16a, so that gate regions corresponding to the gate regions 20, 22 are electrically conductively connected to one another via the doped polycrystalline silicon.

FIG. 14 shows an illustration of the field profile in the substrate region 14 and also in the substrate region 14a. It shall be assumed that the source region 16, the gate region 20 and the gate region 22 are connected to a potential of zero volts. The drain region 18 is connected to a potential of 10 volts. The field lines 240 illustrated in FIG. 14 form for this potential distribution.

The use of the SOI technique and the connection of the substrate 14 mean that the following conditions result for the so-called GIDL (Gate Induced Drain Leakage):

without the use of two gate regions 20, 22, almost all the field lines end on a gate side. With the use of two gate regions 20 to 22, a lower field line density results, leading to an improved breakdown strength of the field-effect transistor 10.

In addition, the field component 170 directed in the x-direction decreases, with the result that the breakdown voltage also rises because of this.

y-Components directed transversely with respect to the component 170 divert the charge carriers to the gate oxide region 100 and 102, respectively. As a result, most of the charge carriers impinge on the gate region 20, 22 before they cause an avalanche-like impact ionization. The gate-controlled breakdown is reduced because the electron/hole generation is greatly reduced through impact ionization. Most of the charge carriers are deflected to the gate oxide 100 and 102, respectively, on account of the curved field lines before they can take up enough energy for an impact ionization. This means, in other words, that the average free path length up to an impact ionization is greater than the path to the gate oxide 100 and 102, respectively. By contrast, for long path distances of a few charge carriers up to the gate oxide 100 and 102, respectively, the charge carriers emit energy through phonon scattering, with the result that they likewise cannot take up enough energy for an impact ionization. On account of the small number of charge carriers with long path distances, the substrate can take up the energy resulting from the phonon scattering without an impact ionization occurring. Consequently, it is also possible to switch voltages of greater than five volts and even greater than nine volts.

The longest distances between substrate region 14 or 14a and connecting portion 28 or region 230 are chosen to be so short that the charge carriers generated can drift very rapidly to the connecting portion 28 or to the region 230 and the substrate 14 or 14a is thus prevented from being flooded with charge carriers. By virtue of the measures mentioned, the high-voltage properties of the field-effect transistor 10 or 10a are considerably improved in comparison with known field-effect transistors.

FIG. 15 shows an exemplary embodiment with two field-effect transistors 250 and 252 connected in parallel, which transistors are essentially constructed like the field-effect transistor 10 in each case. FIG. 15 shows the field-effect transistors 250 and 252 along a section IIIa, the position of which corresponds to the position of the section III.

However, contact holes for connecting portions 254, 256 and 258 have been fabricated in a self-aligning manner with respect to the polysilicon of the gate regions and poly regions. This means that no filling material 30 remains between the connecting portions 254, 256 and 258 and the polycrystalline silicon.

FIG. 16 shows an exemplary embodiment with three field-effect transistors 270, 272 and 274 connected in parallel, which transistors are essentially constructed like the field-effect transistor 10 in each case. FIG. 16 shows the field-effect transistors 270 to 274 along a section IIIb, the position of which corresponds to the position of the section III.

Neither filling material 30 nor connecting portions but rather only polycrystalline silicon is situated between the individual gate regions of the field-effect transistors 270, 272 and 274. However, filling regions 280, 282 and 284, respectively, comprising silicon dioxide are situated above the substrate regions of the field-effect transistors 270 to 274. The filling regions 280 to 284 are patterned in such a way that overlying polycrystalline silicon 290 connects the polycrystalline regions between the field-effect transistors 270 to 274 and at the edges of the field-effect transistors 270 to 274.

FIG. 17 shows the use of four field-effect transistors 320 to 326, which are constructed like the field-effect transistor 10, as driving transistors for a memory cell array 330 in an EEPROM. The field-effect transistors 320 to 326 are part of a driving unit 332, which is separated from the memory cell array 330 in FIG. 17 by a broken line 334. The driving unit 332 drives the memory cell array 330 for example according to the so-called NOR method or according to the NAND method.

The field-effect transistors 320 to 326 have been fabricated by a method as explained above with reference to FIGS. 7A to 12B. Terminals 340, 342, 344 and 346 of the field-effect transistors 320, 322, 324 and 326, respectively, are connected in this order to potentials of plus ten volts, plus sixteen volts, minus ten volts, plus ten volts, respectively. Gate terminals 350 to 356 of the field-effect transistors 320 to 326 are driven by a control unit (not illustrated) in order to drive memory cells of the memory cell array 330 inter alia in accordance with a programming method or in accordance with an erasure method. However, the driving methods are not part of the subject matter of the present application and, therefore, are not explained in any further detail.

FIG. 17 additionally specifies a basic circuit for a memory cell 360 of the memory cell array 330. Further memory cells 362 of a memory matrix are indicated by arrows. The other memory cells of the memory cell array 330 are constructed like the memory cell 360.

The memory cell 360 contains a memory transistor 364 and a selection transistor 366. The memory transistor 364 is a field-effect transistor with a charge-storing intermediate layer 368 between a gate terminal 370 and a channel region. The gate terminal 370 is connected to a word line 372 leading to a terminal 374 of the transistor 324 and to a terminal 376 of the transistor 326. On the word line 372, the voltage of minus ten volts is present during programming and a voltage of plus ten volts is present during erasure. A terminal 378 of the transistor 364 leads to an auxiliary line 380, the potential of which has no influence on the programming and erasure of the memory cell 360. A terminal 382 of the transistor 364 is connected to a terminal 384 of the field-effect transistor 366. A gate terminal 386 of the selection transistor 366 leads to a further word line 388, which is connected to a terminal 390 of the transistor 320 and to a terminal 392 of the field-effect transistor 322. On the word line 388, a voltage of plus ten volts is present during programming and a voltage of plus sixteen volts is present during erasure.

A terminal 394 of the field-effect transistor 366 is connected to a bit line 396, to which the driving unit 332 applies a voltage of six volts during programming and a voltage of zero volts during erasure of the memory cell 360.

The memory cells explained with reference to FIG. 17 are memory cells of an EEPROM. In the case of so-called flash memory modules, there is only a memory transistor in a memory cell 360. A selection transistor 366 is not necessary. In another exemplary embodiment, the memory transistor 364 and the driving transistor 366 are realized in one transistor, i.e. in a so-called split-gate transistor.

What is common to all the memory cell structures mentioned, however, is that erasure voltages and programming voltages of comparatively high magnitude are necessary, which are generated with the aid of the field-effect transistors 320 to 326 according to the invention. The use of the field-effect transistors 320 to 326 means that as the degree of integration increases, the driving unit 332 can be miniaturized in the same way as the memory cell array 330.

Both n-channel field-effect transistors and p-channel field-effect transistors are fabricated. Moreover, as many field-effect transistors as desired each having two control regions can be connected in parallel. The current yield rises with the number of transistors connected in parallel. In the case of conventional transistors, this is achieved through a larger width of the channel.

The threshold voltage Vt of the field-effect transistors can be set through the doping in the channel and by way of the thickness D of the silicon between the two gate regions. In the case of the transistors explained above, the setting of the threshold voltage is not problematic because the threshold voltage Vt does not have to be prescribed by way of the gate oxide thickness, the work function of the gate material or the SOI oxide thickness.

The current yield of the transistors explained is also described by the height of the silicon layer. Purely computationally, the channel width W of a transistor is equal to twice the silicon height. However, since double gate transistors have a significantly better current yield, e.g. a factor of two higher than planar transistors, the required number of transistors connected in parallel can be significantly smaller than would result from purely geometrical consideration. Therefore, single transistors are sufficient for most applications.

In another exemplary embodiment, in addition to the mask window 58 there is also a mask window for the siliciding of the drain region 18. The source region 16 and the drain region 18 are as far as possible completely covered with silicide at their covering area in order to reduce the contact resistance and the sheet resistance.

In all the exemplary embodiments explained, the source regions 16 and the drain regions 18 are, of course, likewise contact-connected, for example with tungsten contacts which extend through the silicate glass 110 and are electrically conductively connected to interconnects in metallization layers.

LIST OF REFERENCE SYMBOLS 10, 10a Field-effect transistor
12, 12a Insulating layer
14, 14a Substrate region
W Channel width
L Channel length
D Thickness
16 Source region
18 Drain region
20, 22 Gate region
24, 26 Poly region
28 Connecting region
30 Filling oxide
I to IV Section plane
50 Metal interconnect
52 Direction arrow
x Channel direction
5-4, 56 Connecting portion
58 Mask window
60 Mirror plane
100, 102 Gate oxide region
104, 106 Salicide region
110 Silicate glass
150 Intermetal dielectric
170 x-Component
172 y-Component
200 Silicon nitride
230 p-Doped region
240 Field line
250, 252 Field-effect transistor
254 to 258 Connecting portion
270 to 274 Field-effect transistor
280 to 284 Filling region
320 to 326 Field-effect transistor
330 Memory cell array
332 Driving unit
334 Broken line
340 to 346 Gate terminal
360 Memory cell
362 Further memory cells
364 Memory transistor
366 Selection transistor
368 Charge-storing intermediate layer
370 Gate terminal
372 Word line
374, 378 Terminal
380 Auxiliary line
382, 384 Terminal
386 Gate terminal
388 Word line
390 to 394 Terminal
396 Bit line

I claim:

1. A method for fabricating a field-effect transistor the method comprising the following steps without restriction by the order specified:
forming a substrate region, wherein the substrate region is surrounded by two terminal regions, two electrically insulating layers, two electrically insulating regions, and an electrically conductive connection region;
forming the two terminal regions, one terminal region being a source region and the other terminal region being a drain region, the source region being arranged at a first side of the substrate region and the drain region being arranged at a second side of the substrate region, the first and the second sides being opposite sides of the substrate region;
forming the two electrically insulating layers and two control regions arranged at a third and fourth side of the substrate region, the third and fourth sides being mutually opposite sides of the substrate region and the two electrically insulating layers being adjoined by control regions, the control regions being located along the third and fourth sides with an insulating layer of the two electrically insulating layers between each of the control regions and the substrate region, the first and second sides being narrower than the third and fourth sides;
forming the two electrically insulating regions, the two electrically insulating regions being arranged at mutually opposite sides of the substrate region, a first insulating region of the two electrically insulating regions being arranged at a fifth side of the substrate region and a second insulating region of the two electrically insulating regions being arranged at a sixth side of the substrate region;
forming the electrically conductive connecting region, which electrically conductively connects one of the terminal regions and the substrate region, the electrically conductive connecting region comprising a metal-semiconductor compound, part of the substrate region being covered by the electrically conductive connecting region and the electrically conductive connecting region also covering a covered area of the source region such that the electrically conductive connecting region extends across the first side of the substrate region to the source region, the part of the substrate region being covered by the electrically conductive connecting region being located between the two electrically insulating layers and between the control regions;
leveling a surface by chemical mechanical polishing after forming the control regions;
etching-back the control regions after polishing; and
performing a self-aligning method for forming the metal-semiconductor compound in the etched-back regions, on the substrate region, and on a terminal region.

2. The method as claimed in claim 1, wherein at least one of:
at least one of the two terminal regions or the substrate region comprises silicon,
the electrically conductive connecting region comprises silicide,
the electrically conductive connecting region is produced by means of a self-aligning method in which a metal is deposited, which forms the metal-semiconductor compound at semiconductor regions, and the metal is removed in regions in which the metal-semiconductor compound was formed.

3. The method as claimed in claim 1 further comprising at least one of:
providing an SOI substrate,
patterning the silicon of the SOI substrate, regions remaining in which the substrate region and the two terminal regions are intended to be arranged,
forming the two control regions after the patterning, and
filling of free regions between the regions that remain with an electrically insulating material.

4. The method as claimed in claim 3, further comprising leveling a surface at least one of after the filling and after forming the two control regions.

5. The method as claimed in claim 4, further comprising performing a self-aligning salicide method for forming the metal-semiconductor compound.

\* \* \* \* \*